(12) United States Patent
Oveis Gharan et al.

(10) Patent No.: US 9,831,987 B2
(45) Date of Patent: *Nov. 28, 2017

(54) STAGGERED PARITY

(71) Applicants: Shahab Oveis Gharan, Nepean (CA); James Harley, Nepean (CA); Kim B. Roberts, Ottawa (CA)

(72) Inventors: Shahab Oveis Gharan, Nepean (CA); James Harley, Nepean (CA); Kim B. Roberts, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/378,834

(22) Filed: Dec. 14, 2016

(65) Prior Publication Data

US 2017/0093528 A1  Mar. 30, 2017

Related U.S. Application Data

(63) Continuation of application No. 14/564,195, filed on Dec. 9, 2014, now Pat. No. 9,537,608.

(51) Int. Cl.
| | |
|---|---|
| *H04L 1/00* | (2006.01) |
| *G06F 11/10* | (2006.01) |
| *H03M 13/15* | (2006.01) |
| *H03M 13/29* | (2006.01) |

(52) U.S. Cl.
CPC .......... *H04L 1/0063* (2013.01); *G06F 11/10* (2013.01); *H03M 13/152* (2013.01); *H03M 13/2921* (2013.01); *H04L 1/0045* (2013.01)

(58) Field of Classification Search
CPC ............ H03M 13/29; H03M 13/2921; H03M 13/2963; H03M 13/152; G06F 11/10; H04L 1/0045; H04L 1/0063
See application file for complete search history.

(56) References Cited

U.S. PATENT DOCUMENTS 6,594,798 B1   7/2003  Chou et al.
8,086,930 B2 * 12/2011  Lee ...................... H04L 1/0043
                                                        714/752

(Continued)

OTHER PUBLICATIONS

Farman, Extended European Search Report for EP 15198464.8, dated Apr. 29, 2016.

*Primary Examiner* — Shelly A Chase
(74) *Attorney, Agent, or Firm* — Integral Intellectual Property Inc.; Miriam Paton; Amy Scouten

(57) ABSTRACT

Forward Error Correction technique: parity vectors are computed such that each parity vector spans multiple FEC frames; in a given FEC frame, a first set of syndrome bits are due to the parity vectors, and a second set of syndrome bits satisfy FEC equations that involve bits of the given FEC frame including the first set of syndrome bits; and the parity vectors are staggered with respect to any sequence in which the FEC frames are processed. Values of decoded bits of a first frame are deduced from known bits of a first parity vector having an effective length of one frame. For parity vectors having an effective length greater than one frame, a Log Likelihood Ratio of each unknown bit associated with the first frame is updated based on known and unknown bits of each parity vector. First frame is decoded using deduced bit values and updated LLR values.

18 Claims, 4 Drawing Sheets

(56) References Cited

U.S. PATENT DOCUMENTS

| | | | |
|---|---|---|---|
| 8,321,769 B1* | 11/2012 | Yeo | H03M 13/2703 |
| | | | 714/785 |
| 8,775,892 B2 | 7/2014 | Zhang et al. | |
| 2006/0020874 A1 | 1/2006 | Desai et al. | |
| 2008/0072122 A1 | 3/2008 | Nimbalker et al. | |
| 2008/0294966 A1 | 11/2008 | Kuroishi et al. | |
| 2009/0300469 A1 | 12/2009 | Rajakarunanayake | |
| 2013/0191696 A1 | 7/2013 | Roberts et al. | |
| 2014/0201604 A1 | 7/2014 | Wang | |

* cited by examiner

STAGGERED PARITY

CROSS-REFERENCE TO PRIOR APPLICATIONS

This is a continuation of U.S. patent application Ser. No. 14/564,195 filed Dec. 9, 2014, the contents of which are hereby incorporated by reference in their entirety.

TECHNICAL FIELD

The present invention relates generally to optical communication systems, and in particular to systems and methods for error correction and data recovery in a coherent receiver.

BACKGROUND

In the field of data communications, it is well known that data can be lost or corrupted during transmission between a sender and a receiver. Typically, the reliability of the communications network is characterised by the Bit Error Ratio (BER), which measures the ratio of erroneously received bits (or symbols) to the total number of bits or symbols transmitted. It is very desirable to achieve error-free customer bits after decoding in the presence of as high of a noise as possible. The key metric is the Energy per customer bit ($E_b$) divided by the noise variance $N_0$, that is: $E_b/N_0$, expressed in decibels (dB).

Various known methods are used to detect and correct data transmission errors, and thereby minimize the BER. An important category of techniques for correcting transmission errors is known as Forward Error Correction (FEC).

Forward Error Correction (FEC) techniques involve processing the data prior to transmission, to generate parity (or check) symbols that may be used at the receiver to detect and correct erroneously received data. Well known FEC schemes include, but are not limited to, Turbo codes, Low-Density Parity Check (LDPC) codes, Block Turbo codes, Reed Solomon codes and BCH codes. For the purposes of the present description, a set of parity (or check) symbols generated over a block of data is referred to as a parity vector, irrespective of its actual format or representation.

As is known in the art, FEC techniques have an advantage that they avoid the need for storing and resending data packets, but at a cost of increased overhead.

It is desirable to minimize the overhead, and have a very high noise tolerance, which has led to the use of iterative sparse-graph FEC techniques such as Turbo codes and LDPC codes. However, these techniques suffer from a problem in that a decoded frame may contain residual errors that cannot be corrected by the selected FEC scheme. This problem may arise due to either channel effects (such as cycle slips) or limitations of the FEC algorithm itself, and normally affects a minority of the frames comprising a given signal. However, even when most of the frames are correctly decoded, a small number of decoded frames with significant residual errors can raise the BER of the signal as a whole. Within limits, the error-correction performance of iterative FEC techniques can be improved by increasing the number of iterations implemented by the decoder. However, there is a lower limit to the BER that can be achieved by these techniques, which cannot be further reduced by additional iterations. This lower limit is referred to as an "error floor". In the case of Turbo codes and LDPC codes, for example, error floors in the range of $10^{-4}$ to $10^{-10}$ are often encountered, which is unacceptably high for many users of optical transmission systems. Code designs that maximize error correction performance at high noise levels (low signal to noise ratio (SNR)) often raise the error floor. For high speed optical communications systems, hardware implementations of the FEC decoder are required, but this also raises the error floor.

Co-pending US patent Publication No. 2013/0191696, which published Jul. 25, 2013, describes a FEC technique in which a super-frame comprises N-frames including a set of two or more data frames and a parity frame that is calculated across the set of data frames. Each bit of the parity frame is calculated using at least one bit from each one of a plurality of the data frames. With this arrangement, if any one of the N frames of the superframe fails to converge in the FEC decoder, then the errored frame can be recovered based on the other N−1 correctly decoded frames in the super-frame. This technique is beneficial in that it increases tolerance to "error bursts" characterised by a large number of errored bits within a single frame, and also has a very low error floor compared to conventional techniques. However, it has been found that this technique does not significantly improve $E_b/N_0$.

The problem to be solved is how to optimize the Energy per customer bit ($E_b$) divided by the noise variance No, (that is: $E_b/N_0$), while minimizing the error floor.

Techniques for data recovery that overcome limitations of the prior art remain highly desirable.

SUMMARY

Disclosed herein are techniques for error correction and data recovery in an optical communications system.

Accordingly, aspects of the present invention provide a method and apparatus of forward error correction. A FEC encoder: processes a data signal to generate a sequence of FEC frames, and computes a plurality of parity vectors. Each parity vector spans a plurality of the FEC frames. A respective subset of systematic bits of each FEC frame is associated with a corresponding subset of parity bits in each one of the parity vectors. Finally, a respective location of the parity bits associated with a first FEC frame in one of the parity vectors is different from the respective location of the parity bits associated with the first FEC frame in another one of the parity vectors.

A further aspect of the present invention provides a method and apparatus in which a FEC decoder receives a plurality of FEC frames and parity vectors. A value of decoded data bits of a first FEC frame associated with a first parity vector having an effective length of one frame are deduced based on known values of parity bits of the first parity vector. For each parity vector having an effective length corresponding to more than one FEC frame, a Log Likelihood Ratio (LLR) of each unknown parity bit associated with the first FEC frame is updated based on known and unknown parity bit values of each parity vector. The first FEC frame is decoded using the deduced decoded data bit values and the updated LLR of each unknown parity bit associated with the first FEC frame.

BRIEF DESCRIPTION OF THE DRAWINGS

Representative embodiments of the invention will now be described by way of example only with reference to the accompanying drawings, in which.

It will be noted that throughout the appended drawings, like features are identified by like reference numerals.

DETAILED DESCRIPTION

In very general terms, there are provided techniques in which a set of two or more parity vectors are computed across a plurality of data frames in a staggered manner relative to the sequence of the data frames, such that as each data frame is processed in sequence by a FEC decoder, the effective length (ie the number of unconverged random variables) of each of the parity vectors are reduced at different times. The shorter the parity vector, the more information it contains about each of the random variables that remain within it. A simple parity vector having an effective length of L=1 is entirely known. The information from a parity vector may be used to improve the Log Likelihood Ratio (LLR) of data bits within it that have not yet converged in the FEC decoder.

Figure 1:
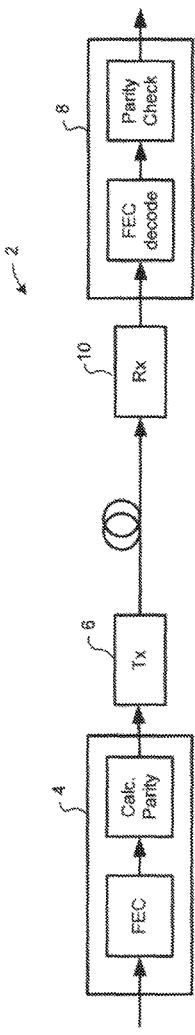
FIG. 1 schematically illustrates a representative optical communications system in which methods in accordance with the present invention may be implemented.

FIG. 1 schematically illustrates a representative optical communications system 2 of the type in which methods in accordance with the present technique may be implemented. As may be seen in FIG. 1, a FEC encoder 4 associated with a transmitter 6 may comprise a signal processor implementing a desired FEC scheme to process an input data stream to generate FEC frames, comprising encoded data and parity symbols, as will be described in greater detail below. The FEC frames are then passed to the transmitter 6 for transmission through the system to the receiver 10. Similarly, a FEC decoder 8 associated with a receiver 10 may comprise a signal processor implementing appropriate decoding and frame reconstruction operations using the received FEC fames.

The signal processors at the transmitter and receiver ends of the system 2 may be implemented by any suitable combination of hardware and/or software such as, for example, a general purpose computer programmed using suitable software. However, using current technology, software-based solutions are expected to be too slow. Accordingly, in preferred embodiments, the signal processors are implemented entirely in hardware, for example using field Programmable gate Arrays (FPGAs) or Application Specific Integrated Circuits (ASICs). In some embodiments, the signal processor may be implemented as two or more processor blocks pipelined together.

Figure 2:
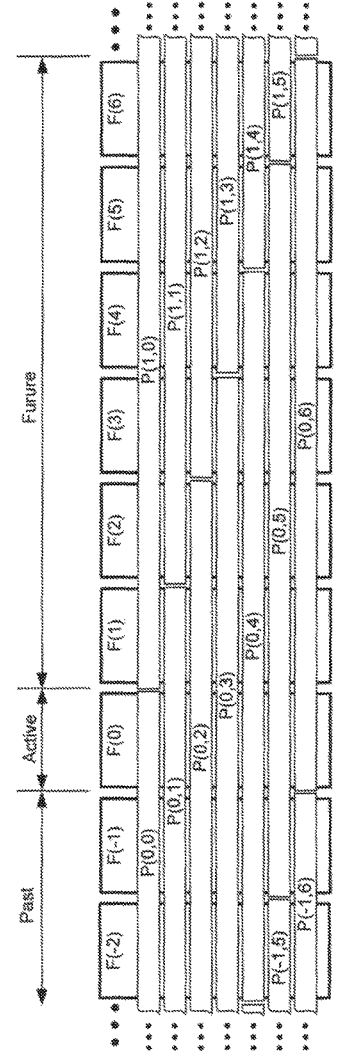
FIG. 2 schematically illustrates relationships between data frames and parity vectors in accordance with a first representative embodiment of the present invention.

FIG. 2 is a block diagram illustrating staggered parity in accordance with the present technique. In the example of FIG. 2, a series of nine FEC frames (F(−2), F(−1), F(0) . . . F(6)) are shown arranged in sequence. In this example, the index (t) identifies the temporal order in which the FEC frames F(t) are generated by the FEC encoder 4, but other indexing schemes could equally be used to identify each FEC frame. In some embodiments, a plurality of FEC frames F(t) may be buffered in sequence to facilitate computation of the parity vectors, but this is not essential. In principle, any desired FEC encoding scheme, such as the known BCH may be used to encode the data signal to generate the FEC frames F(t). Parity vectors with a single added parity bit (simple parity) are used in these descriptions, for simplicity. Other parity equations may be used.

As is known in the art, a FEC frame typically comprises "systematic bits" representing the encoded data, and "syndrome bits" representing parity (or check) bits. Typically, the syndrome bits within a FEC frame relate to the systematic bits of that frame, and are substantially independent of the systematic and syndrome bits of any other FEC frames. The present technique departs from this common scenario in three ways. First, the syndrome bits are calculated using a block of data that spans multiple frames, and so the syndrome bits within any given frame relate to systematic bits or more than one frame. (Advantageously, the syndrome bits in a frame are separated into two sets, with the first set being due to parity vectors across frames, and the second set being due to FEC equations applied to bits within that frame, including the bits of the first set.) Second, multiple sets of syndrome bits are calculated in parallel using a respective subset of the data bits of any given frame, and the union of those subsets contains at least most of the bits in that frame. For simplicity in this description, any bits not participating can be considered to be not part of the frame. This means that, within any given frame, the syndrome bits are divided into groups, each of which belongs to one of a plurality of parity vectors, and relates to a respective subset of the systematic bits of other frames. Advantageously, each parity vector contains at most one bit from a given frame. Finally, the parity vectors are staggered in time, relative to the sequence of the frames, so that each group of syndrome (and/or possibly systematic) bits within a given frame occupies a respective time location within its parity vector that is different from the location occupied by at least three other groups of syndrome (and/or possibly systematic) bits within its parity vector. FIG. 2 schematically illustrates this arrangement with a specific example where different parity groups inside each FEC frame reside in different location with respect to the starting FEC position within their own parity vector. (For simplicity of visualization, in this example the time order is identical to the bit ordering in a parity vector.) This means that upon decoding FEC frames in time, each FEC frame takes the advantage of having parity vectors with a range of different effective lengths due to either the known values of contributing bits to each parity vector from previously converged FEC frames or their high level of LLR confidence due to partial convergence. This helps each FEC frame to observe an "averaged" effective parity length which is much smaller than "L".

Referring to FIG. 2, there is shown a set of frames F(t), in which t represents the temporal order in which the frames are generated by a FEC encoder, and thus the nominal order in which the frames in which the frames are decoded in order to recover the original data stream. Also shown in FIG. 2 is a set of parity vectors P(x,y) computed by a FEC encoder. In the figure, x is an index that identifies the temporal order of a block of parity vectors, and y is an index that identifies an individual parity vector within a given block. As may be appreciated, the use of x and y indexes for referencing parity vectors is not essential, but rather is selected for convenience of description and ease of understanding. In fact, any suitable means of referencing parity vectors may be used. Indeed, it is not necessary to consider parity vectors as being grouped into defined sets or blocks, although in some cases it may be convenient to do so.

As may be seen in FIG. 2, each parity vector P(x,y) is computed over a block of data bits that spans a set of seven frames. However, in general, different parity blocks may have different length. In some embodiments, it is convenient to indicate the length L of each parity vector P(x,y) in terms of the number of frames that it encompasses. In this case, the parity vectors P(x,y) of FIG. 2 all have a length of L=7. Other suitable metrics of parity vector length may be used, if desired. In practice, it has been found that parity vector lengths less than about L=5 tend to be inefficient, whereas increasing simple parity vector lengths beyond about L=20 increases complexity (and thus cost) of encoding and decoding with little additional performance gain compared to shorter vectors. A compromise of length of between L=12 and L=17 has been found to provide acceptable performance with reasonable processor complexity, but the present technique is not limited to any particular range of parity vector lengths.

As may be seen in FIG. 2, within any given block of parity vectors (for example P(0,y), 0 ... y ... 6) the parity vectors are staggered in time, such that each successive parity vector P(0,y) begins one frame later than the previous parity vector P(0,y−1). Hence, as the FEC frames are decoded in time either sequentially or partially in parallel, parity vectors with large number of bits coming from past FEC frames, will get the most advantage by improving their parity information (or equivalently, reducing their effective length). However, as parity vectors are staggered in time, each FEC frame benefits with the same portion from the shortened length parity vectors. In principle, any suitable encoding scheme, (such as, for example, a binary Single Parity Check (SPC) product code, or Low Density Product Code (LDPC)) may be used to calculate each parity vector and each FEC equation. In some embodiments, all of the parity vectors are generated using the same encoding scheme, such as Single Parity Check (SPC). In other embodiments, different encoding schemes may be used to generate different ones of the parity vectors. For example, in some embodiments it may be desirable to compute LDPC FEC equations, and SPC parity vectors.

For convenience of illustration, each of the parity vectors P(x,y) in FIG. 2 are arranged in rows. In some embodiments, it may be convenient to compute the parity vectors in this manner. For example, a rectangular product code scheme generates FEC blocks which are commonly considered as a rectangular frame of m rows and m columns. In some embodiments, m=127, but other values are equally possible. In such embodiments it is convenient to use a set of M parity vectors, and sub-divide the FEC frame into M subsets of m/M rows. Each subset of m/M rows of the frame can then be assigned to a respective one of the M parity vectors. In some embodiments, each parity vector contains parity bits computed using the same row (or subset of rows) of each of its FEC frames. In other embodiments, each parity vector contains bits from a respective different row (or subset of rows) of each of its FEC frames. Other patterns can also be defined, as desired.

In the example embodiment illustrated in FIG. 2, M=7, and each parity vector P(x,y) is computed over a respective subset of m/7 rows of L=7 consecutive frames F(t). In addition, each parity vector P(x,y) contains parity bits computed using the same row (or subset of rows) of each of its FEC frames. Thus, for example, parity vector P(1,0 ) may contain parity bits computed from rows 0-13 of each one of frames F(1) ... F(7), while parity vector P(1,1) contains parity bits computed from rows 14-27 of each one of frames F(2) ... F(8), and so on.

Figure 3:
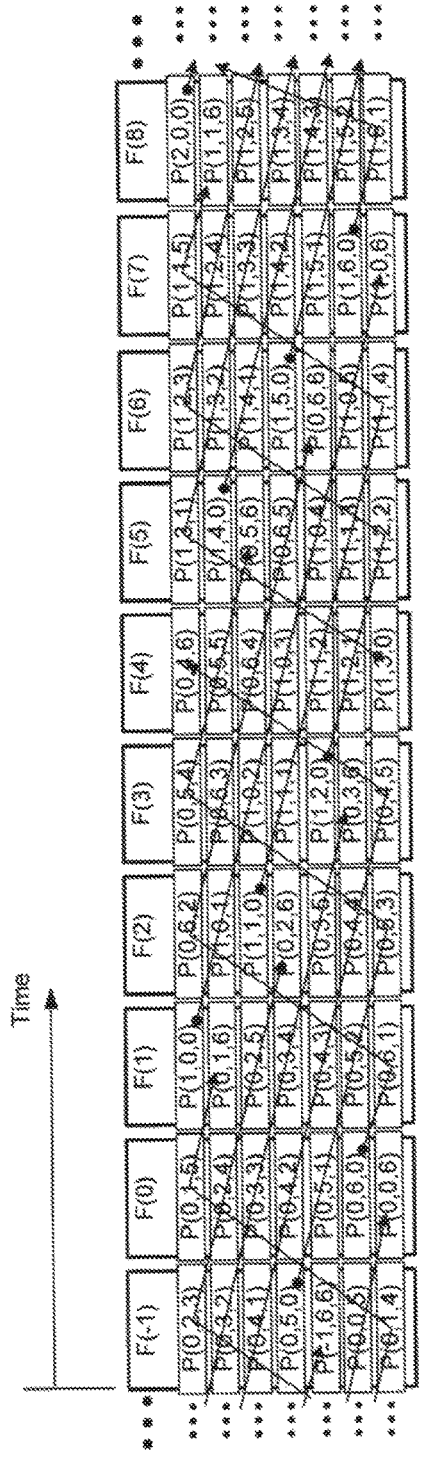
FIG. 3 schematically illustrates relationships between data frames and parity vectors in accordance with a second representative embodiment of the present invention.

FIG. 3 illustrates an example embodiment in which M=7, L=7, and each parity vector P(x,y,z) is computed over a respective subset of rows of L=7 consecutive frames F(t). In this embodiment, the index z (1 ... z ... L−1) identifies a respective portion of a given parity vector. Thus, for example, parity vector P(1,0,z) comprises L=7 portions or sub-blocks, each of which contains parity bits calculated using systematic bits of a respective one of frames F(1) ... F(7). In the embodiment of FIG. 2, the bits which construct a parity vector are all selected from the same relative position inside their corresponding FEC frames. Therefore the individual portions are not shown. The embodiment of FIG. 3 differs from the arrangement of FIG. 2 in that each portion z of a given parity vector P(x,y) contains bits selected from different parts of each FEC frame. Thus, for example, parity vector P(1,0,z) contains parity bits computed from a first portion of FEC frame F(1); the $2^{nd}$ portion of FEC frame F(2); the $3^{rd}$ portion of FEC frame F(3), etc. For ease of understanding, the pattern of traced by the parity vectors across FEC frames F(−1) to F(8) are illustrated using arrows, which extend from a first portion P(x,y,0) to a final portion P(x,y,L−1) of each parity vector.

The examples described above with reference to FIGS. 2 and 3 allocate a respective subset of rows of a FEC frame F(t) to each parity vector P(x,y,z). It will be appreciated that systematic bits of each FEC frame can be allocated to parity vectors in other patterns. For example, each parity vector P(x,y,z) may be associated with a subset of columns of a frame, rather than rows. The rows (or columns) of systematic bits allocated to each parity vector do not need to be contiguous, but rather may be interleaved with the rows (or columns) allocated to other parity vectors. The allocation of rows (or columns) of systematic bits to each parity vector is particularly suited to SPC codes. Other encoding schemes may be implemented with different patterns of systematic bits being allocated to each parity vector. For example, LDPC codes may be computed using systematic bits distributed across the entire frame F(t). In some embodiments, there are M parity vectors, and every $M^{th}$ systematic bit of a FEC frame is allocated to a respective one of the parity vectors.

As noted above, an important feature of the present technique is that the parity vectors are staggered with respect to the sequence of FEC frames, such that any given FEC frame occupies a respective different time portion of each parity vector. Thus, in the example of FIG. 2, FEC frame F(0) occupies the last position of parity vector P(0,0), and the next-to-last position of parity vector P(0,1). Additionally, the effective length L' of any given parity vector drops to L'=1 at a different time than that of other parity vectors. As will be described in greater detail below, these features significantly reduce error floors, and improve $E_b/N_0$.

Figure 4:
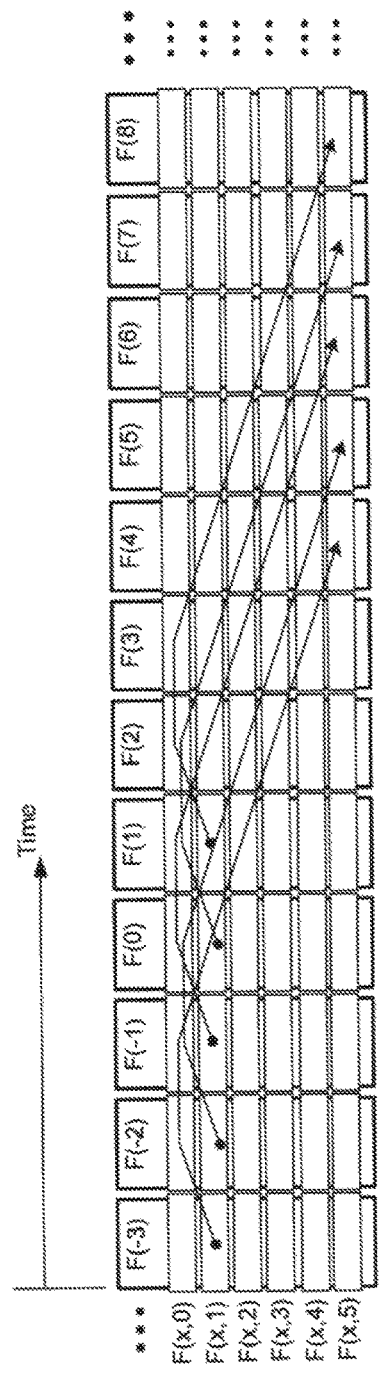
FIG. 4 schematically illustrates relationships between data frames and parity vectors in accordance with a third representative embodiment of the present invention.

In the embodiments described above with reference to FIGS. 2 and 3, the parity vectors are non-overlapping. That is, a given subset of bits of each FEC frame are associated with only one parity vector. FIG. 4 shows an embodiment in which parity vectors are at least partially overlapping. In the embodiment of FIG. 4, each frame is divided into M=6 subsets of m/M rows, which are labeled as F(x,y), where x is an index that identifies the frame, and y (y=0 ... M−1) is an index that identifies each subset of rows. Each subset is assigned to a parity vector, following the pattern shown by the arrows in FIG. 4. In the example of FIG. 4, the length of each parity vector is L=8. This length is larger than the number of bits (or subsets of bits) inside each FEC frame. This means that at least some of the bits of each frame contribute to two or more parity vectors. As an example, the portion F(0, 1) contributes to two parity vectors which extend to portions F(4, 5) and F(7, 5), respectively. Staggered parity is designed such that bits of each FEC frame which observe a large effective length of their associated parity vector benefit from information of multiple parity vectors. As an example, considering FEC frame F(0) and assuming previous FEC frames (i.e. F(−1), F(−2), . . . ) are decoded, the FEC frame portion F(0, 1) is associated with two parity vectors having effective lengths of 5 and 8 respectively. Combining the independent information coming from the 2 parity vectors helps to significantly improve LLR quality of F(0, 1). The FEC portions F(0, 5), F(0, 4) are not associated with multi-parity vectors because their effective parity vector length is already small, and it has been found to be advantageous to have more equal sharing of the strengthening across the bits.

The embodiments described above describe staggered parity with a sequence of FEC frames where parity vectors are staggered in time.

In some embodiments, it might be suitable to have multiple parallel FEC sequences in time where parity vectors are staggered on exactly one of the parallel FEC sequences. Such embodiments would be preferable for hardware decoder engines capable of processing many parallel FEC frames.

In some embodiments, it would be beneficial to stagger each parity vector not only in time, but also across parallel FEC sequences. Such designs are favorable to avoid high dependence of decoding performance of each FEC frame on the decoding performance of previous FEC frames. Moreover, such staggering across sequences would help to increase the minimum Hamming distance of valid codeword sequences across multiple FEC sequences, and as a result, reducing the FEC error floor.

Figure 5:
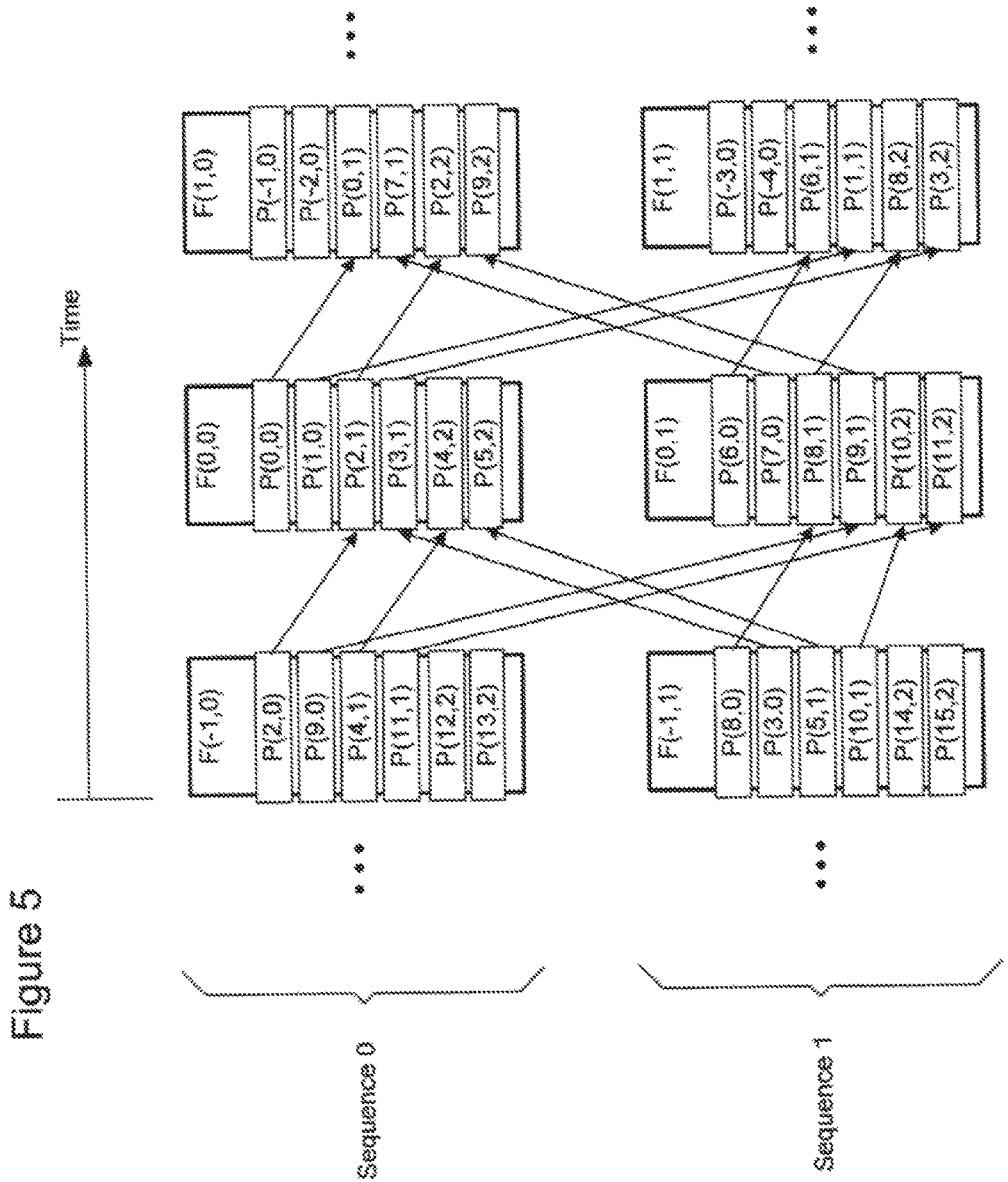
FIG. 5 schematically illustrates relationships between data frames and parity vectors in accordance with a fourth representative embodiment of the present invention.

As an example, FIG. 5 depicts an embodiment in which 2 parallel sequences of FEC frames are generated. In this figure, the bits constructing each parity vector are staggered in time. However, at least some of the parity vectors are also interleaved across the two FEC sequences. As an example, the bits constructing parity vector P(2) (i.e. P(2, 0), P(2, 1), P(2, 2)) all reside in the 1$^{st}$ FEC sequence. However, the bits constructing the parity vector P(9) (i.e. P(9, 0), P(9, 1), P(9, 2)) are selected across two FEC sequences. In particular, portions P(9, 0) and P(9, 2) of parity vector P(9) are selected from the 1$^{st}$ FEC sequence, while portion P(9, 1) is selected from the 2$^{nd}$ FEC sequence.

Referring back to FIG. 2, consider a scenario in which FEC frame F(0) of FIG. 2 is currently being processed by the FEC decoder. FEC frames F(−1), F(−2) etc. have already been processed, and FEC frames F(1)-F(6) are buffered and awaiting processing by the FEC decoder. The parity bits within each parity vector may be classified into three states, namely:

State 1: A random variable where the Log Likelihood Ratio (LLR) value is available and is a valid estimate and being improved in time by FEC decoder. Parity bits in State 1 are those bits associated with a FEC frame that is currently being processed by the FEC decoder. In FIG. 2, parity bits associated with FEC frame F(0) are in state 1.

State 2: A random variable where a static noisy LLR value due to the received channel value is known. Parity bits in State 2 are those bits associated with FEC frames that have been buffered, but have not yet arrived at the FEC decoder for processing and improvement and convergence to the stable known values through the FEC decoder. In FIG. 2, parity bits associated with FEC frames F(1)-F(6) are in state 2.

State 3: A formerly random variable where the bit value is now known with certainty. Parity bits in State 3 are those bits associated with FEC frames that have already been successfully decoded. In FIG. 2, these are FEC frames received and successfully processed prior to FEC frame F(0), that is, any of frames F(−1), F(−2) . . . etc. that have been successfully decoded.

As noted above, while a FEC frame is being processed, the parity bits associated with that frame are in state 1. If a FEC frame is known to have converged to be error free, then all of the parity bits associated with that block are in state 3. FEC frames that have been buffered but not yet arrived to the processing hardware have parity bits in state 2.

For any given parity vector, if one or more bits are in state 2, then the bits are not known with certainty, but a meaningful update of any LLR value is still possible using that parity vector. The shorter the effective length L', the more meaningful the update can be. However, as more bits of a parity vector enter state 3, the effective length L' of that parity vector is reduced, and this reduction in the effective length can be used to improve the overall decoding performance. In fact, when the effective length reaches L'=1, then the remaining (i.e. state 1 or 2) bits of that parity vector can be entirely deduced from those bits of the parity vector that are already in state 3.

For any one parity vector and any one frame, the number of bits from that frame that are part of that vector can be denoted as N. It is advantageous to have N small so that a burst of errors in one unconverged block has a bounded effect on the parity vectors. Generally, N should be less than the Hamming distance between valid vectors, known as the Hamming distance of the vector. For an SPC this means that N<2 is desirable.

For example, consider a scenario in which the FEC decoder has already successfully decoded FEC-frames prior to frame F(0) (that is, frames F(−1), F(−2) . . . etc). At the start of decoding frame F(0), the associated parity bits within parity vector P(0, 0) are already entirely known for each bit, because all of the other bits of that parity vector are already known (i.e. are in state 3) by virtue of the FEC decoder having successfully decoded the previous FEC frames. Consequently, decoded data bit values of frame F(0) associated with parity vector P(0, 0) can be directly deduced from parity vector P(0, 0) and the known data bits of the previously decoded frames F(−6) . . . F(−1). The known values of the data bits within frame F(0) can be used to improve both the probability of successfully decoding the entire frame F(0) and to speed the frame decoding process by reducing the number of iterations required to achieve convergence of the frame.

Furthermore, parity vector P(0, 1) has an effective length of L'=2 as previous bits (associated with previously decoded frames F(−5) . . . F(−1)) are already known. More generally, the bits of FEC frame F(0) associated with parity vector P(0, m) observe an effective parity vector length L'=m, because only "m" bits from the remaining FEC-frames F(0), F(1) . . . , F(m−1) remain in either of states 1 or 2.

Averaged over all of the parity vectors, each FEC frame F(t) observes an averaged effective parity vector length of about L'=L/2. This reduced effective parity vector length improves the LLR of each data bit in the frame, thereby achieving an overall improvement in FEC decoder performance. In fact, the gain will be much higher than the Bit Error Ratio (BER) gain after decoding a parity vector of length L, as the FEC decoder is operating on Parity vectors with a mixture of different length from L'=1 . . . L. In some embodiments, the staggered parity in accordance with the present technique can yield an $E_b/N_0$ as much as 1 dB better than conventional FEC methods.

In practice, it is possible that there may be a number of consecutive FEC frames F(0), F(1), F(2) being decoded simultaneously. This could arise due to: I) Different FEC frames might require different number of iterations (and therefore time) to be decoded depending on their SNR quality, and there may be a limited memory buffer at the input of FEC decoder, and II) There may be multiple parallel decoding engines within the FEC decoder, each of which may be used for decoding FEC frames consecutively. The techniques described below are tolerant of this simultaneous decoding situation.

It is contemplated that staggered parity in accordance with the present technique may be implemented using suitable modifications to conventional FEC encoder/decoder hardware and software, and that such modifications will be well within the purview of those of ordinary skill in the art based on the teaching of the present disclosure. Accordingly, detailed descriptions of conventional FEC encoder/decoder hardware and software will not be presented herein. Rather, the following description will focus on the important features of staggered FEC, so that the ordinarily skilled reader will be able to modify a conventional FEC encoder/decoder to implement techniques in accordance with the present invention. The following description describes representative staggered parity encoder operation for an example case in which Single Parity Check (SPC) parity vectors are computed for FEC frames generated using BCH(113, 127, 5) encoding.

For FEC-frame F(t), let us assume t=L*k+p, where 0<=p<L. In other words, t≡p (modulo L). We have:

$$\forall r, \left\lfloor \frac{rL}{112} \right\rfloor = p: F(t, r) = \sum_{\tau=t-L+1}^{t-1} F(\tau, r)$$

Where r is an index that identifies a row of the frame F(t). Notice that in the above equation the summation operation (Σ) is applied modulo 2. Furthermore, F(t, r) is a vector of length equal to the length of a row in the FEC frame (i.e. 127 in the case of BCH(113, 127, 5) encoding), so the summation is indeed vector summation. Finally, ⌊x⌋ is the floor function which is defined as the largest integer number y where y≤x.

Notice that as F(τ, r) is a valid BCH codeword, their summation modulo 2 is also a valid BCH codeword. Hence, F(t, r) is a valid BCH codeword. Hence, it is not necessary to generate the syndrome bits for the r'th row of Frame F(t), as its syndrome bits will be automatically calculated by the summation.

FIG. 2 shows the flow of staggered parity vectors in time for the case of L=7. Notice that in this example a 112×127 submatrix of each BCH(113, 127, 5) encoded FEC frame is allocated to a set of M=7 SPC parity vectors. As may be seen in FIG. 2, the length of each SPC parity vector is L. Furthermore, the SPC parity vectors are staggered in time relative to the sequence of the FEC frames. With this arrangement, $$\text{the effective rate of } FEC \text{ is equal to} \approx \frac{L-1}{L}\left(\frac{113}{127}\right)^2.$$

The reason is that we intentionally ignored the negligible rate difference due to CRC's and the fact that we apply Simple Parity over the first 112 rows of each frame.

The benefit of staggered parity can be observed from FIG. 2. In the decoder, as FEC frames are decoded in time, the number of unknown bits in each unsolved parity vector is reduced, which helps the FEC decoder to successfully decode the next FEC frame.

In order to get a better understanding, let us assume that the FEC decoder already decoded FEC-frames F(−1), F(−2) . . . etc. successfully. At the start of decoding F(0), parity vector P(0, 0) has an effective length L'=1, and consequently the parity bits in the portion of parity vector P(0, 0) associated with frame F(0) are entirely known for each bit, because all other bits of that parity vector (associated with frames F(−1), F(−2), F(−3) etc.) have already been decoded. Since the parity vector P(0, 0) is completely known, values for each data bit of frame F(0) associated with parity vector P(0, 0) can be directly deduced from the already known parity bits. In the case of SPC codes, the "unknown data bits" of F(0) associated with parity vector P(0, 0) can be deduced by summing the known bits of the parity vector P(0, 0). This reduces the number of data bits of frame F(0) that need to be decoded by the FEC decoder, which both reduces the number of iterations required for the FEC frame to converge, and (because at least some of the bits of the frame are already known) increases the likelihood that that the FEC frame will converge.

Furthermore, the bits which belong to P(0, 1) observe an effective parity vector of length L'=2 (rather than L) because previous bits (associated with frames F(−1), F(−2) etc.) have already been decoded to state 3 successfully. In general, the data bits of frame F(0) which belong to the parity vector P(0, m) observe an effective parity vector length of L'=m, since only "m" bits from the remaining FEC frames F(0), F(1) . . . , F(m−1) are not yet resolved. So, by applying SPC extrinsic operation, an improvement is seen in uncoded BER and mutual-information at the input of the FEC decoder. In fact, the gain will be much higher than the BER gain after decoding a parity vector of length "L" as there are a mixture of parity codes with respective different effective lengths from L'=1 . . . L. Notice that a parity vector with an effective length L'=0 is deterministically known at the input to the decoder.

For example, consider an arbitrary SPC parity vector of length L, which consists of parity bits: b(1), b(2), b(3) . . . b(i) . . . b(L). We can divide the set of bits to 3 subsets: S(Past), S(Active) and S(Future). The subset S(Active) comprises the subset of parity bits which are currently being decoded by the FEC decoder, and so correspond with the State 1 bits described above. S(Past) comprises the subset of parity bits which have previously been determined by the FEC decoder, either successfully or with an error, and so correspond with the State 3 bits described above. S(Future) comprises the subset of parity bits which have been buffered, but are not yet started being decoded by the FEC decoder. Thus the subset S(Future) comprises bits that correspond with the State 2 bits described above. Although the subset S(Future) has not started being processed, the respective uncoded LLR values of these bits are recorded in the input buffer memory. So, we have $$\{b(1),b(2),b(i),\ldots,b(L)\}=S(\text{Past})\cup S(\text{Active})\cup S(\text{Future}).$$

Figure 6:
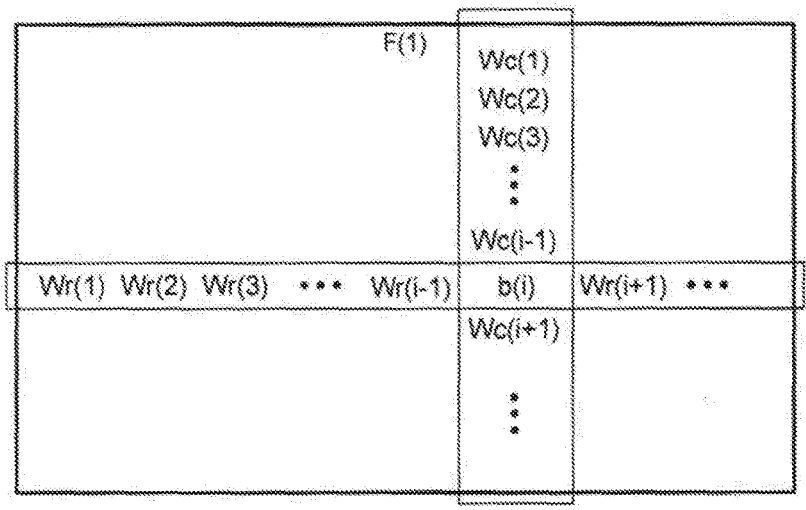
FIG. 6 schematically illustrates computation of extrinsic LLR values.

For each bit b(i) where b(i)∈S(Active) ∪S(Future), we have the received channel (input) LLR which we can denote as R(i). Furthermore, for each bit b(i) belonging to S(Active), extrinsic LLR values can calculated by a row decoder BCH and a column BCH decoder, and may be denoted as Wr(i) and Wc(i), respectively, as may be seen in FIG. 6. Finally, for bits b(i) where b(i)∈S(Past), the decoded values are already available, and may be denoted as C(i). In addition, the FEC decoder also generates extra information indicating whether or not the data bits corresponding to b(i) have been decoded successfully.

Figure 7:
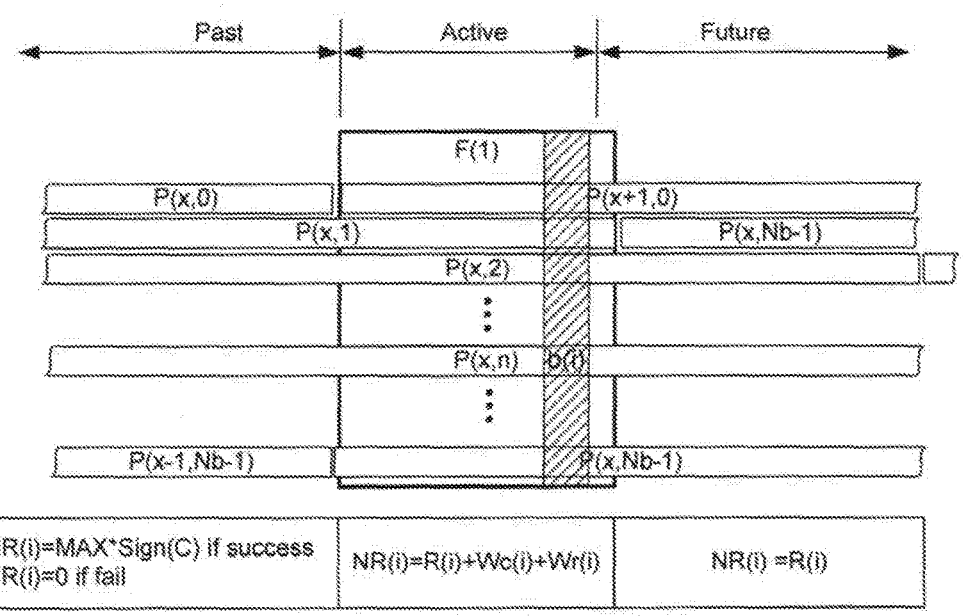
FIG. 7 schematically illustrates updating LLR values of parity bits associated with a FEC frame using the extrinsic LLR values of FIG. 6.

Based on the above definitions, an intrinsic LLR input vector NR=[NR(1), NR(2), . . . , NR(L)] can be supplied to the FEC decoder. As may be seen in FIG. 7, the intrinsic LLR input vector NR may be calculated as follows:

$$NR(i) = \begin{cases} \text{MAX} * \text{Sign}(C(i)) & b(i) \in S(\text{Past}) FEC(b(i)) \text{ Decoded with no Error} \\ R(i) & b(i) \in S(\text{Past}) FEC(b(i)) \text{ Decoded with Error} \\ R(i) + Wc(i) + Wr(i) & b(i) \in S(\text{Active}) \\ R(i) & b(i) \in S(\text{Future}) \end{cases}$$

Based on the input intrinsic LLR vector NR, we can calculate extrinsic SPC LLR information (which may be denoted as Wp(i)) for bits b(i) which belong to S(Active). Different approaches may be used to calculate the extrinsic SPC LLR information Wp(i), including a Min-Max Approach, and a Sum-Product approach. Both of these approaches are described below.

The Min. Max. Approach for extrinsic SPC LLR update calculates extrinsic LLR values Wp(i) by choosing the maximum terms in the nominator and denominator of the LLR expression. The result may be formulated as:

$$\forall i, b(i) \in S(\text{Active}): Wp(i) = \left(\prod_{j\neq i} \text{sign}(NR(j))\right) \min_{j\neq i} |NR(j)|$$

Notice that in the above formula, the $\min_{j\neq i} |NR(j)|$ can be calculated by just having the minimum value and $2^{nd}$ minimum value in the set as follows. Assume the minimum value and $2^{nd}$ minimum value between NR(i=1 . . . L) is calculated $$m_0 = \min_j |NR(j)| \text{ and } NR(j_0) = m_0 \text{ and } m_1 = \min_{j\neq j_0} |NR(j)|.$$

Furthermore, let us pre-calculate $S_0 \triangleq \Pi_{j=1}^L \text{sign}(NR(j))$. Then, we have:

$$\forall i, b(i) \in S(\text{Active}): Wp(i) = S_0 \times \text{sign}(NR(i)) \times \begin{cases} m_1 & \text{if } |NR(i)| = m_0 \\ m_0 & \text{otherwise} \end{cases}$$

The Sum Product Approach for extrinsic SPC LLR update calculates extrinsic LLR values Wp(i) exactly (i.e. with no approximations) by including all terms inside the nominator and denominator of the LLR expression. The result is:

$$\forall i, b(i) \in S(\text{Active}): Wp(i) = \prod_{j\neq i} \text{sign}(NR(j)) \cdot \phi\left(\sum_{j\neq i} \phi(|NR(j)|)\right),$$

$$\phi(x) \triangleq \log\left(\frac{e^x + 1}{e^x - 1}\right)$$

Notice that in both approaches described above, it is possible to significantly simplify the terms in the equation by pre-calculating the contributing term coming from any bits within the subsets S(Future) and S(Past). In other words, for bits belonging to S(Past), only their decoded LLR sign-bit value are required (i.e. their LLR magnitude values are not required). Furthermore, for bits belonging to S(future), their LLR magnitude and sign value are not modified as long as their corresponding FEC frame is not sent to the FEC decoder. Hence, it is possible to pre-calculate their contribution in the equation as a fixed term which does not need to be updated in every SPC decoding iteration. In other words, their contributing factor would be modified as soon as they are fetched to the FEC decoder from the input buffer. For example, using the Min-Max approach, it is possible to pre-calculate:

$$m_f \leftarrow \min_{b(j) \in S(\text{Future})} |R(j)|, s_f \leftarrow \prod_{b(j) \in S(\text{Future})} \text{sign}(R(j))$$

Notice that the value of $m_f$ and $s_f$ needs to be updated only when a FEC frame is stored in or removed from the input buffer.

The same approach may be used to simplify contributing terms in the Sum-Product approach. For this purpose, we can use the same term $s_f$ for sign contributor factor and a new term $m_f$ which is equal to.

$$m_f \triangleq \phi(\Sigma_{b(i) \in S(\text{Future})} \phi(|R(j)|))$$

An update algorithm can be described as follows:
i) Upon fetching bit b(i) out of the input-buffer, we have:
$m_f \leftarrow \phi(\phi(m_f) - \phi(|R(i)|)), s_f \leftarrow s_f \text{sign}(R(i))$ ii) Upon feeding bit b(i) into the input-buffer, we have:
$m_f \leftarrow \phi(\phi(m_f) + \phi(|R(i)|)), s_f \leftarrow s_f \text{sign}(R(i))$ In the row and column BCH decoders, the SPC extrinsic information may be utilized as follows:
In the column BCH decoder: NR(i)←Wp(i)+Wr(i)+R(i)
In the row BCH decoder: NR(i)←Wp(i)+Wc(i)+R(i)

Notice that for embodiments in which parity vectors are at least partially overlapping (such as the one depicted in FIG. 4), the different extrinsic parity values which are brought from different vectors to which each bit belongs will be added together. As an example, for each bit which belongs to F(0, 1), two parity extrinsic values Wp$_1$(i) and Wp$_2$(i) are calculated corresponding to the parity vectors it contributes to. Hence, the input for column BCH decoder would be NR(i)←Wp$_1$(i)+Wp$_2$(i)+Wr(i)+R(i). Notice that in some embodiments, one might send extrinsic values of each parity vector to the other one it is overlapping with. As an example, in embodiment of FIG. 4, the parity vector which extends from F(−3, 1) to F(4, 5) can send its extrinsic parity values to the parity vector which extends from F(0, 1) to F(7, 5), as they have overlapping bits in F(0, 1). However, such designs are not advantageous in practice as they add to complexity and delay of the circuit.

Although the invention has been described with reference to certain specific embodiments, various modifications thereof will be apparent to those skilled in the art without departing from the spirit and scope of the invention as outlined in the claims appended hereto.

What is claimed is:

1. A method of forward error correction (FEC), the method comprising a FEC encoder:
    processing a data signal to generate a sequence of FEC frames; and
    computing parity vectors such that
        each parity vector spans multiple FEC frames;
        in a given FEC frame, a first set of syndrome bits are due to the parity vectors, and a second set of syndrome bits satisfy FEC equations that involve bits of the given FEC frame including the first set of syndrome bits; and
        the parity vectors are staggered with respect to a sequence in which the FEC frames are processed.

2. The method as claimed in claim 1, wherein at least one of the parity vectors is computed using a binary Single Parity Check (SPC) encoding scheme.

3. The method as claimed in claim 1, wherein the bits of a parity vector are computed from a subset of rows or columns of rectangular product FEC frames.

4. The method as claimed in claim 3, wherein the subset of rows or columns are dis-contiguous.

5. The method as claimed in claim 4, wherein the subset of rows or columns associated with a first parity vector are interleaved with the subset of rows or columns associated with at least one other parity vector.

6. The method as claimed in claim 1, wherein at least one of the parity vectors is computed using a Low Density Parity Check (LDPC) encoding scheme.

7. The method as claimed in claim 1, further comprising a FEC decoder:
    receiving a plurality of the FEC frames and parity vectors;
    processing bits of a first parity vector and updating an estimate of at least one bit in a first FEC frame based on the processing result; and
    decoding the first FEC frame using the updated estimate.

8. The method as claimed in claim 7, wherein updating the estimate of at least one bit comprises computing a respective Log Likelihood Ratio (LLR) of the at least one bit.

9. The method as claimed in claim 7, wherein processing bits of a first parity vector comprises:
    deducing values of parity bits of the first parity vector corresponding to a subset of bits of a first FEC frame that has been successfully decoded; and
    calculating a local Log Likelihood Ratio (LLR) of parity bits of the first parity vector corresponding to a subset of bits of a second FEC frame that has not been successfully decoded.

10. The method as claimed in claim 8, wherein updating the estimate of at least one bit comprises computing the sum of an LLR of the at least one bit and the processing result.

11. A Forward Error Correction (FEC) encoder comprising:
    a processor configured to process an input data signal to generate a sequence of FEC frames; and
    a parity calculator configured to compute parity vectors such that
        each parity vector spans multiple FEC frames,
        in a given FEC frame, a first set of syndrome bits are due to the parity vectors, and a second set of syndrome bits satisfy FEC equations that involve bits of the given FEC frame including the first set of syndrome bits; and
        the parity vectors are staggered with respect to a sequence in which the FEC frames are processed.

12. The Forward Error Correction encoder as claimed in claim 11, wherein at least one of the parity vectors is computed using a binary Single Parity Check (SPC) encoding scheme.

13. The Forward Error Correction encoder as claimed in claim 11, wherein at least one of the parity vectors is computed using a Low Density Parity Check (LDPC) encoding scheme.

14. The Forward Error Correction encoder as claimed in claim 11, wherein the bits of a parity vector are computed from a subset of rows or columns of rectangular product FEC frames.

15. The Forward Error Correction encoder as claimed in claim 14, wherein the subset of rows or columns are dis-contiguous.

16. The Forward Error Correction encoder as claimed in claim 15, wherein the subset of rows or columns associated with a first parity vector are interleaved with the subset of rows or columns associated with at least one other parity vector.

17. A Forward Error Correction (FEC) decoder comprising:
    a buffer configured to receive a plurality of FEC frames; and
    a processor configured to
        process bits of a first parity vector and update an estimate of at least one bit in a first FEC frame based on the processing result; and
        decode the first FEC frame using the updated estimate,
    wherein the processor is configured to update an estimate of at least one bit in a first FEC frame by
        deducing a value of decoded data bits of a first FEC frame associated with a first parity vector having an effective length of one FEC frame, based on known values of parity bits of the first parity vector; and
        for each parity vector having an effective length corresponding to more than one FEC frame, updating a Log Likelihood Ratio (LLR) of each unknown parity bit associated with the first FEC frame based on known and unknown parity bit values of each parity vector,
    wherein the effective length of any parity vector is the number of FEC frames associated with unknown bits in that parity vector.

18. A Forward Error Correction (FEC) decoder comprising:
    a buffer configured to receive a plurality of FEC frames; and
    a processor configured to
        process bits of a first parity vector and update an estimate of at least one bit in a first FEC frame based on the processing result; and
        decode the first FEC frame using the updated estimate, wherein the plurality of FEC frames and the first parity vector were generated by a Forward Error Correction encoder comprising
a processor configured to process an input data signal to generate a sequence of FEC frames; and
a parity calculator configured to compute parity vectors such that
each parity vector spans multiple FEC frames,
in a given FEC frame, a first set of syndrome bits are due to the parity vectors, and a second set of syndrome bits satisfy FEC equations that involve bits of the given FEC frame including the first set of syndrome bits; and
the parity vectors are staggered with respect to a sequence in which the FEC frames are processed.

* * * * *